US009128339B2

(12) United States Patent
Lee

(10) Patent No.: US 9,128,339 B2
(45) Date of Patent: Sep. 8, 2015

(54) ULTRA HIGH RESOLUTION LIQUID CRYSTAL DISPLAY HAVING A COMPENSATING THIN FILM TRANSISTOR AT EACH PIXEL

(71) Applicant: LG DISPLAY CO., LTD., Seoul (KR)

(72) Inventor: Jungil Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 74 days.

(21) Appl. No.: 13/948,638

(22) Filed: Jul. 23, 2013

(65) Prior Publication Data

US 2014/0183539 A1    Jul. 3, 2014

(30) Foreign Application Priority Data

Dec. 31, 2012    (KR) .................. 10-2012-0158351

(51) Int. Cl.
  *G02F 1/1362*    (2006.01)
  *H01L 29/786*    (2006.01)
(52) U.S. Cl.
  CPC ...... *G02F 1/13624* (2013.01); *G02F 1/136286* (2013.01); *H01L 29/78645* (2013.01); *G02F 2201/40* (2013.01)

(58) Field of Classification Search
  None
  See application file for complete search history.

(56) References Cited

U.S. PATENT DOCUMENTS

| 2008/0131818 | A1* | 6/2008 | Ha et al. ................... 430/319 |
| 2010/0128192 | A1* | 5/2010 | Kim et al. ................... 349/46 |
| 2010/0225831 | A1* | 9/2010 | Takeuchi et al. ............ 348/739 |
| 2011/0234556 | A1* | 9/2011 | Uehara et al. ............... 345/204 |
| 2011/0279734 | A1* | 11/2011 | Tsubata ...................... 348/731 |

* cited by examiner

*Primary Examiner* — Khaja Ahmad
(74) *Attorney, Agent, or Firm* — Brinks Gilson & Lione

(57) ABSTRACT

The present disclosure relates to an ultra high-resolution liquid crystal display having a compensating thin film transistor at each pixel. The present disclosure suggests a thin film transistor substrate comprising: gate lines running in horizontal direction and data lines running in vertical direction which define a plurality of pixel area on a substrate; a first gate electrode and a second gate electrode formed by dividing any one gate line disposed at any one of an upper side and a lower side; a first thin film transistor connected to the first gate electrode; and a second thin film transistor connected to the first thin film transistor and the second gate electrode. The flat panel display according to the present disclosure has an ultra high-density resolution over 300PPI with the high aperture ratio.

11 Claims, 5 Drawing Sheets

ULTRA HIGH RESOLUTION LIQUID CRYSTAL DISPLAY HAVING A COMPENSATING THIN FILM TRANSISTOR AT EACH PIXEL

CROSS-REFERENCE TO RELATED APPLICATION

This application claims priority to Republic of Korea Patent Application No. 10-2012-0158351 filed on Dec. 31, 2012, which is incorporated by reference herein in its entirety.

Field of the Disclosure

The present disclosure relates to an ultra high-resolution liquid crystal display (or 'LCD') having a compensating thin film transistor (or 'TFT') at each pixel. Especially, the present disclosure relates to a pixel structure having high aperture ratio for ultra high resolution LCD having a compensation TFT to compensate the On/Off current characteristics of the TFT for driving the pixel.

Discussion of the Related Art

Nowadays, as the information society is developed, the requirements of displays for representing information are increasing. Accordingly, the various flat panel displays (or 'FPD') are developed for overcoming many drawbacks of the cathode ray tube (or 'CRT') such as heavy weight and bulk volume. The flat panel display devices include the liquid crystal display device (or 'LCD'), the field emission display (or 'FED'), the plasma display panel (or 'PDP'), the organic light emitting display device (or 'OLED') and the electrophoresis display device (or 'ED').

The display panel of a flat panel display may include a thin film transistor substrate having a thin film transistor allocated in each pixel area arrayed in a matrix manner. For example, the liquid crystal display device represents video data by controlling the light transitivity of the liquid crystal layer using the electric fields. According to the direction of the electric field, the LCD can be classified in the two major types; one is vertical electric field type and the other is the horizontal electric field type.

For the vertical electric field type LCD, a common electrode formed on an upper substrate and a pixel electrode formed on a lower substrate are facing with each other for forming an electric field of which direction is perpendicular to the substrate face. A twisted nematic (TN) liquid crystal layer disposed between the upper substrate and the lower substrate is driven by the vertical electric field. The vertical electric field type LCD has merit of higher aperture ratio, while it has demerit of narrower view angle about 90 degree.

For the horizontal electric field type LCD, a common electrode and a pixel electrode are formed on the same substrate in parallel. A liquid crystal layer disposed between an upper substrate and a lower substrate is driven in In-Plane-Switching (or 'IPS') mode by an electric field parallel to the substrate face. The horizontal electric field type LCD has a merit of wider view angle over 160 degrees and faster response speed than the vertical electric field type LCD. However, the horizontal electric field type LCD may have demerits such as low aperture ratio and transitivity ratio of the back light.

In the IPS mode LCD, for example, in order to form the in-plane electric field, the gap between the common electrode and the pixel electrode may be larger than the gap between the upper substrate and the lower substrate, and in order to get enough strength of the electric field, the common electrode and the pixel electrode may have a strip pattern having certain width. Between the pixel electrode and the common electrode of the IPS mode LCD, the electric field horizontal with the substrate is formed. However, just over the pixel electrode and the common electrode, there is no electric field. That is, the liquid crystal molecules disposed just over the pixel electrodes and the common electrodes are not driven but maintain the initial conditions (the initial alignment direction). As the liquid crystal molecules in the initial condition cannot control the light transitivity properly, the aperture ratio and the luminescence may be degraded.

For resolving these demerits of the IPS mode LCD, the fringe field switching (or 'FFS') type LCD driven by the fringe electric field has been proposed. The FFS type LCD comprises the common electrode and the pixel electrode with the insulating layer there-between, and the gap between the pixel electrode and the common electrode is set narrower than the gap between the upper substrate and the lower substrate. So that, a fringe electric field having a parabola shape is formed in the space between the common electrode and the pixel electrode as well over these electrodes. Therefore, most of all liquid crystal molecules disposed between the upper substrate and the lower substrate can be driven by this fringe field. As a result, it is possible to enhance the aperture ratio and the front luminescence.

FIG. 1 is a plane view illustrating a thin film transistor substrate having an oxide semiconductor layer included in a fringe field type liquid crystal display according to the related art. FIG. 2 is a cross-sectional view illustrating the structure of the thin film transistor substrate of FIG. 1 by cutting along the line I-I' according to the related art.

The thin film transistor substrate shown in FIGS. 1 and 2 comprises a gate line GL and a data line DL crossing each other with a gate insulating layer GI therebetween on a lower substrate SUB, and a thin film transistor T formed at each crossing portion. By the crossing structure of the gate line GL and the data line DL, a pixel area is defined. In the pixel area, a pixel electrode PXL and a common electrode COM facing each other with a second passivation layer PAS2 therebetween are disposed for forming the fringe field. For example, the pixel electrode PXL has a rectangular shape corresponding to the shape of the pixel area, and the common electrode COM has a plurality of strips disposed in parallel each other.

The common electrode COM is connected to a common line CL disposed in parallel with the gate line. GL. A reference voltage (or 'common voltage') is supplied to the common electrode COM through the common line CL.

The thin film transistor T charges and maintains the pixel signal voltage to the pixel electrode PXL by responding to the gate signal of the gate line GL. To do so, the thin film transistor T comprises a gate electrode G branched from the gate line GL, a source electrode S branched from the data line DL, a drain electrode D facing the source electrode S and connecting to the pixel electrode PXL, and a semiconductor layer SE overlapping with the gate electrode G having the gate insulating layer GI therebetween for forming a channel between the source electrode S and the drain electrode D.

The semiconductor layer SE is made of poly silicon material, as it has high electron mobility characteristics. The middle portions of the poly silicon layer SE overlapping with the gate electrode G may be defined as an active layer A (the channel area). The other portions of the poly silicon layer SE except the active layer A may be two conductive areas by plasma treatment. The one side of the conductive area may be contacted with the source electrode S via a source contact hole SH, and the other side of the conductive area may be contacted with the drain electrode D via a drain contact hole DH. In other words, the poly silicon semiconductor layer SE comprises a source area SA contacting the source electrode S, a drain area DA contacting the drain electrode D, and an active (or 'channel/') layer A overlapping with the gate electrode G between the source area SA and the drain area DA.

In the fringe field type LCD, the pixel electrode PXL and the common electrode COM are overlapped each other. Within the overlapped space, a storage capacitance is formed. In order to form the fringe field and to charge the storage capacitance enough, the TFT should have high performance. For example, to satisfy the requirement of the fringe field type LCD, it is preferable to use the thin film transistor substrate having the poly-silicon semiconductor layer with the top gate structure.

Referring to FIG. 2, we will explain about the structure of the thin film transistor having the poly silicon semiconductor material in the top gate structure. At first, on the substrate SUB a semiconductor layer SE is formed. A gate insulating layer GI is deposited over the substrate SUB having the semiconductor layer SE. On the gate insulating layer GI, a gate electrode G is formed to overlap with an active layer A, which is the middle portion of the semiconductor layer SE.

On the gate electrode G, an intermediate insulating layer IN is deposited to cover all surface of the substrate SUB. By penetrating the intermediate insulating layer IN and the gate insulating layer GI, a source contact hole SH and a drain contact hole DH exposing the source area SA and the drain area DA of the semiconductor layer SE, respectively, are formed. On the intermediate insulating layer IN, a source electrode S contacting the source area SA via the source contact hole SH and a drain electrode D contacting the drain area DA via the drain contact hole DH are formed.

A first passivation layer PAS1 is deposited over the whole surface of the substrate SUB having the top gate type tin film transistor T. Further, a pixel contact hole PH exposing some portions of the drain electrode D is formed by penetrating the first passivation layer PAS1.

The pixel electrode PXL formed on the first passivation layer PAS1 is contacted to the drain electrode D via the pixel contact hole PH. On the other hand, the common electrode COM is formed to overlap with the pixel electrode PXL on the second passivation layer PAS2 covering the pixel electrode PXL. Between the pixel electrode PXL and the common electrode COM, the fringe electric field is formed. In addition, within the space formed by the overlapping structure of the pixel electrode PXL and the common electrode COM, the storage capacitance is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent desired gray scale.

The Off-Current characteristics of the thin film transistor having the poly-silicon semiconductor material may be easily degraded. In order to compensate this degraded Off-Current characteristics of the driving thin film transistor, a compensating thin film transistor may be further required. Like this case, by adding the compensating TFT in the pixel area, the aperture ratio may be reduced because the non-transitive area is increased. Therefore, required is a pixel structure in which the aperture ratio is not reduced so much even the compensating TFT is included in the pixel area.

SUMMARY

A thin film transistor substrate comprises: gate lines running in horizontal direction and data lines running in vertical direction which define a plurality of pixel area on a substrate; a first gate electrode and a second gate electrode formed by dividing any one gate line disposed at any one of an upper side and a lower side; a first thin film transistor connected to the first gate electrode; and a second thin film transistor connected to the first thin film transistor and the second gate electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
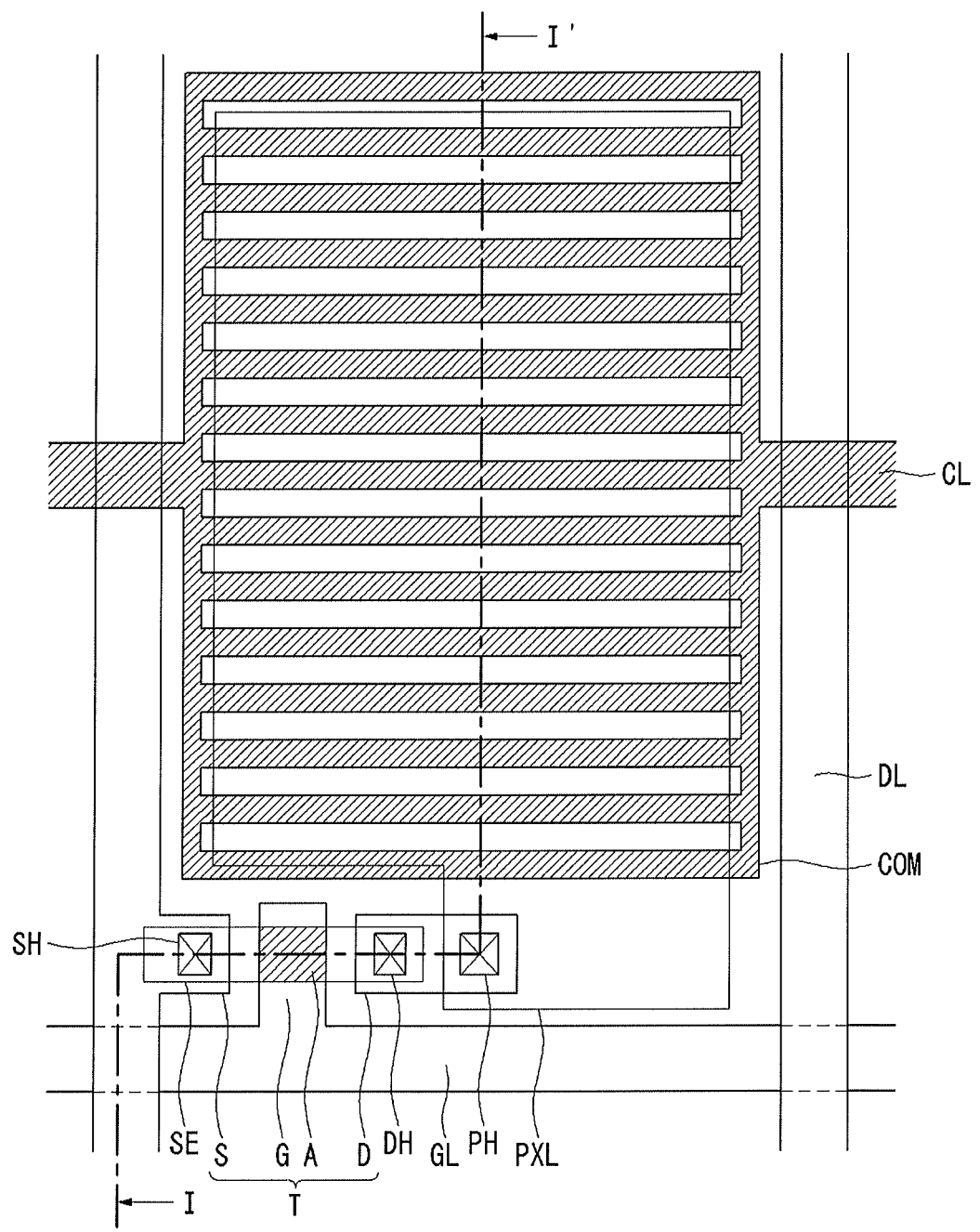
FIG. 1 is a plane view illustrating a thin film transistor substrate having an oxide semiconductor layer included in a fringe field type liquid crystal display according to the related art.
Figure 2:
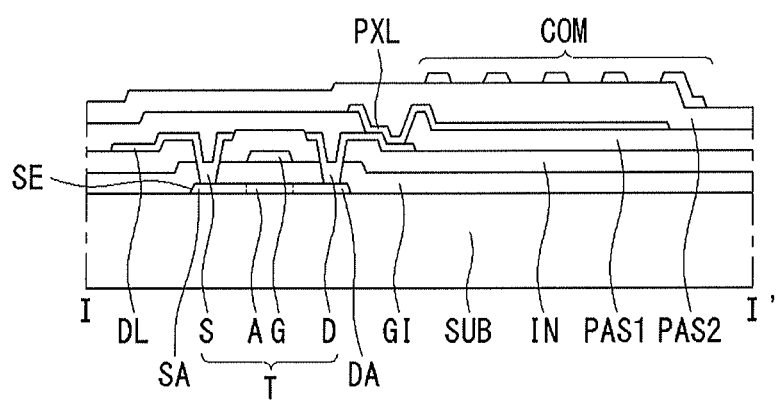
FIG. 2 is a cross-sectional view illustrating the structure of the thin film transistor substrate of FIG. 1 along the line I-I' according to the related art.

Referring to attached figures, embodiments of the present disclosure will be described. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

Figure 3:
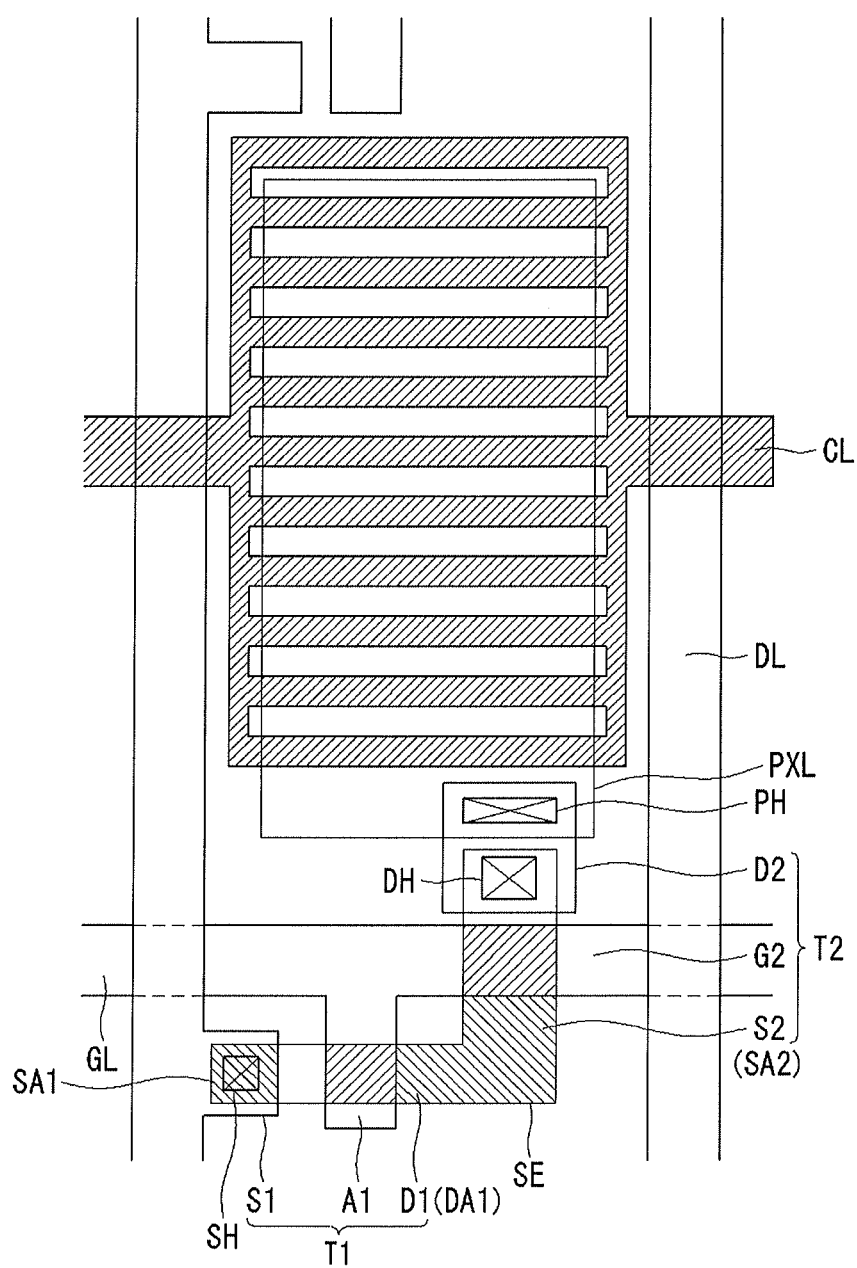
FIG. 3 is a plane view illustrating the structure of a thin film transistor substrate having a compensation thin film transistor according to the first embodiment of the present disclosure.

Referring to FIG. 3, we will explain about the first embodiment of the present disclosure. FIG. 3 is a plane view illustrating the structure of a thin film transistor substrate having a compensation thin film transistor according to the first embodiment of the present disclosure. FIG. 3 is the diagram illustrating a thin film transistor substrate for an ultra high definition resolution liquid crystal display over 300PPI, having the compensation thin film transistor in each pixel. Hereinafter, the driving thin film transistor T1 and the compensation thin film transistor T2 are named for distinguish each other so it is not required that the order and position of them would be same as shown in the figures.

The thin film transistor substrate according to the first embodiment of the present disclosure comprises a plurality of pixel areas defined by a plurality of gate lines GL and a plurality of data lines DL, which cross each other with a gate insulating layer GI therebetween. Each pixel area comprises a pixel electrode PXL and a common electrode COM facing each other with a second passivation layer PAS2 therebetween, for forming a fringe electric field. The pixel electrode PXL has a rectangular shape corresponding to the shape of the pixel area, and the common electrode COM has a plurality of strips disposed in parallel each other.

In each pixel area, one driving thin film transistor T1 is disposed. Further, one compensation thin film transistor T2 is disposed in each pixel area for compensating the Off-Current characteristics of the driving thin film transistor T1. The drain electrode D1 of the driving thin film transistor T1 is connected to the source electrode S2 of the compensation thin film transistor T2.

Now, we will explain about the structure of the thin film transistor substrate having the driving thin film transistor T1 and the compensation thin film transistor T2 which are connected in serial. On the substrate SUB, the pixel areas disposed in a matrix manner are defined by the crossing structure of the gate lines GL running in horizontal direction and the data lines DL running in vertical direction.

The gate electrode G1 of the driving thin film transistor T1 is branched from the gate line GL to the pixel area. The source electrode S1 of the driving thin film transistor T1 is branched from the date line DL to the pixel area, especially to the gate electrode G1. The semiconductor layer SE of the driving thin film transistor T1 is extended from the source electrode Si and overlapped with the gate electrode G1. The drain electrode D1 of the driving thin film transistor T1 is not formed as a separated electrode. The drain electrode D1 would be the drain area DA1. The semiconductor layer SE comprises a source area SA1 contacting the source electrode S1, a channel area A1 overlapping with the gate electrode G1, and the drain area DA1 formed at the side opposing the source area SA1 from the gate electrode G1.

The gate electrode G2 of the compensation thin film transistor T2 is not formed separately. One portion of the gate line DL would be used as the gate electrode G2 of the compensation TFT T2. The source electrode S2 of the compensation thin film transistor T2 is not formed separately, neither. The source area SA2 expanded from the drain area DA1 of the semiconductor layer SE would be the source electrode S2 of the compensation TFT T2. The drain electrode D2 of the compensation thin film transistor T2 is connected to the drain area DA2 formed at the side opposing the source area SA2 from the gate electrode G2 of the compensation TFT T2.

In the first embodiment of the present disclosure, in order to connect the driving TFT T1 and the compensation TFT T2 serially, following structure would be preferred as shown in FIG. 3. The gate electrode G1 of the driving TFT T1 may be extruded to the next pixel area disposed at the next row from the current pixel area. The semiconductor layer SE may be disposed as starting from the next row pixel area, overlapping with the gate line GL and extending to the current row pixel area. The drain electrode D2 of the compensation TFT T2 is connected to the pixel area PXL formed in the current pixel area.

The pixel electrode PXL is overlapped with the common electrode COM having a passivation layer therebetween. The common electrode COM is connected to the common line CL disposed in parallel with the gate line GL. A reference voltage (or 'common voltage') is supplied to the common electrode COM through the common line CL. Between the pixel electrode PXL and the common electrode COM, a fringe electric field is formed. Further, within the overlapped space of the pixel electrode PXL and the common electrode COM, a storage capacitance is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent desired gray scale.

In the case of low density resolution liquid crystal display less than 300PPI, the pixel area is relatively large so that the area for the driving TFT T1 and the compensation TFT T2 is not occupying so much large ratio in the pixel area. Furthermore, in the fringe field type, the aperture ratio can be easily ensured because the storage capacitance is not formed separately but formed by the overlapping structure of the pixel electrode PXL and the common electrode COM. Therefore, the area of the compensation TFT T2 does not severely affect to the reduction of the aperture ratio.

However, in the case of ultra high-density resolution liquid crystal display over 300PPI, the situation is totally different. As the number of pixel is increasing, the size of each pixel should be getting smaller. On the other hands, the size of the thin film transistors T1 and T2 should not be getting smaller as the size of the pixel because the characteristics of the TFTs should be kept. Consequently, in the ultra high-density resolution flat panel display, the area ratio of the thin film transistors T1 and T2 in the pixel area would be getting larger. As the area for the TFTs T1 and T2 is the non-transmittance area, it may be key causes for the reducing of the aperture ratio in the ultra high-density resolution.

In the first embodiment, in order to reduce the area ratio of the driving TFT T1 and the compensation TFT T2 in the pixel area, the gate electrode G2 of the compensation TFT T2 is not formed separately, but one portion of the gate line GL may be used as the gate electrode G2 of the compensation TFT T2. However, it is not enough to ensure the aperture ratio for the case of the super ultra high-density resolution over 400PPI.

Figure 4:
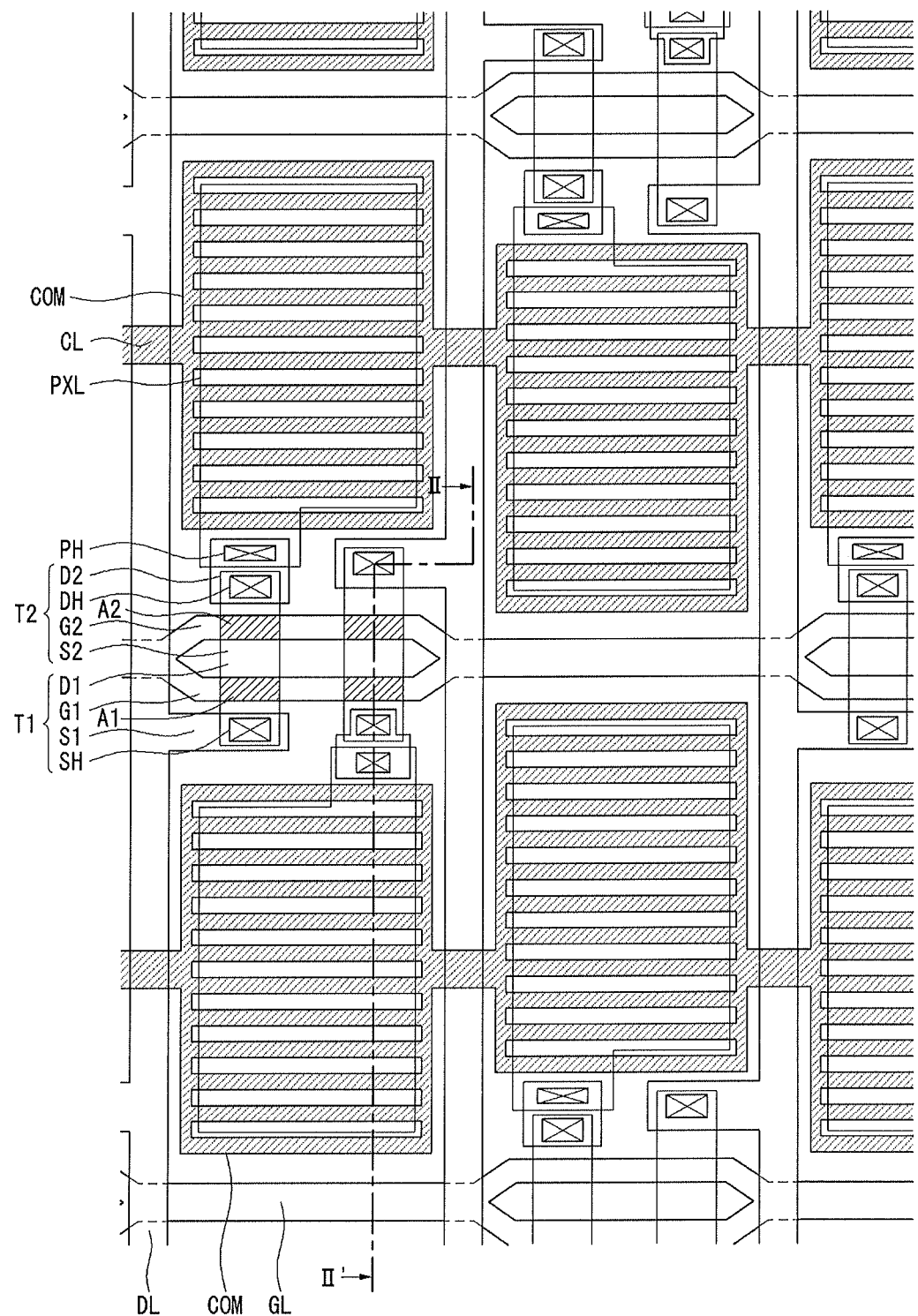
FIG. 4 is a plane view illustrating the structure of a thin film transistor substrate having a compensation thin film transistor according to the second embodiment of the present disclosure.
Figure 5:
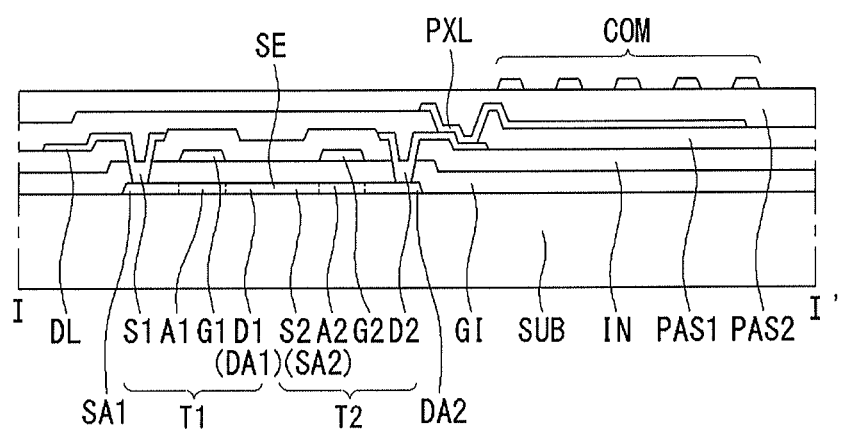
FIG. 5 is a cross-sectional view illustrating the thin film transistor substrate having a compensation thin film transistor by cutting along the line in FIG. 4.

Hereinafter, further referring to FIGS. 4 and 5, we will explain about the second embodiment of the present disclosure. FIG. 4 is a plane view illustrating the structure of a thin film transistor substrate having a compensation thin film transistor according to the second embodiment of the present disclosure. FIG. 5 is a cross-sectional view illustrating the thin film transistor substrate having a compensation thin film transistor by cutting along the line II-II' in FIG. 4. Here, the driving thin film transistor T1 and the compensation thin film transistor T2 are named for distinguish each other so it is not required that the order and position of them would be same as shown in the figures.

The second embodiment suggests a super ultra high-density resolution (over 400PPI) liquid crystal display in which the aperture ratio reduction is minimized even if the compensation thin film transistor is further comprised. The thin film transistor substrate according to the second embodiment comprises a gate electrode, which is not extruded to the pixel area from the gate line, but one portion of the gate line is used as the gate electrode. Especially, the second embodiment suggests an example of structure in which the gate line itself is used as the gate electrodes of the driving TFT and the compensation TFT.

On the substrate SUB, a plurality of pixel areas having rectangular shape defined by a plurality of gate lines GL and a plurality of data lines DL, which cross each other. Specifically, one pixel area is defined by the two data lines DL disposed at left and right sides and the two gate lines GL disposed at upper and lower sides.

Here, any one of the gate line DL among the upper side gate line and the lower side gate line is divided into two branches for being used as the gate electrode. These two gate electrode formed by the divided gate line is commonly used as the gate electrode for the current pixel area and the next row pixel area. That is, one gate line GL may be commonly allocated to two pixel electrodes which are neighbored in vertical each other.

Further referring to FIGS. 3 and 4, we will explain in detail. By dividing the gate line GL in the upper branch and the lower branch, the gate electrode G1 of the driving TFT T1 and the gate electrode G2 of the compensation TFT T2 are formed. The gate line GL, the gate electrode G1 of the driving TFT T1, and the gate electrode G2 of the compensation TFT T2 are disposed in horizontal direction and parallel each other.

As the gate electrodes G1 and G2 are for the upper (or 'current') pixel electrode PXL and the lower (or 'next row') pixel electrode PXL, the semiconductor layer SE may be formed as extending from the upper pixel area to the lower pixel area and crossing the gate electrodes G1 and G2.

A source electrode S1 of the driving TFT T1 is formed as being branched from the data line DL to the pixel area and being parallel with the gate electrode G1 of the driving TFT T1. The source electrode S1 of the driving TFT T1 contacts one side of the semiconductor layer SE.

The semiconductor layer SE comprises a source area SA1 contacting the source electrode S1 of the driving TFT T1, an active channel layer A1 of the driving TFT T1 overlapping with the gate electrode G1 of the driving TFT T1, a drain area D1 of the driving TFT T1 and a source area S2 of the compensation TFT T2, an active channel layer A2 of the compensation TFT T2, and a drain area D2 of the compensation TFT T2.

That is, the driving TFT T1 and the compensation TFT T2 are serially connected each other via the semiconductor layer SE. The semiconductor layer SE is extended by running from the lower pixel area, passing the gate electrodes G1 and G2, reaching to the upper pixel area. In that case, the source electrode S1 of the driving TFT T1 is disposed at the lower pixel area. The drain electrode D2 of the compensation TFT T2 is disposed at the upper pixel area and connected to the pixel electrode PXL formed at the upper pixel area.

The source electrode Si branched from the left side data line DL is supplied with the data voltage for driving the upper pixel electrode PXL. On the contrarily, the source electrode 51 branched from the right side data line DL is supplied with the data voltage for driving the lower pixel electrode PXL. The semiconductor layer SE passing the left side of the gate electrodes G1 and G2 is for driving the upper pixel electrode. The semiconductor layer SE passing the right side of the gate electrodes G1 and G2 is for driving the lower pixel electrode. In other example, the reversed structure is possible.

The gate electrodes G1 and G2 formed by dividing one gate line GL disposed at upper side (or 'lower side') into two segments are allocated to the upper and lower pixel area commonly. At the lower side (or 'upper side'), there is only one segment of the gate line GL is disposed. Considering one pixel area, in the first embodiment, the gate electrodes G1 and G2 are disposed at the upper side and the lower side. On the contrary, in the second embodiment, the gate electrodes G1 and G2 are disposed at only any one side of the upper and lower sides. Therefore, the second embodiment has merits in which the area ratio of the TFTs T1 and T2 in the pixel area can be minimized. In some actual examples, the second embodiment has 15% 20% higher aperture ratio than the first embodiment.

Further referring to FIG. 5, we will explain about the structure of the thin film transistor having the poly silicon semiconductor material in the top gate structure according to the second embodiment of the present disclosure. On the substrate SUB, a semiconductor layer SE is formed. On the whole surface of the substrate SUB having the semiconductor layer SE, a gate insulating layer GI is deposited. On the gate insulating layer GI, gate electrodes G1 and G2 overlapping with an active channel layers A1 and A2 (the middle portions of the semiconductor layer SE) is formed.

On the gate electrodes G1 and G2, an intermediate insulating layer IN is deposited to cover the whole surface of the substrate SUB. Penetrating the intermediate insulating layer IN and the gate insulating layer GI, formed are a source contact hole SH and a drain contact hole DH exposing the source area SA1 of the driving TFT T1 and the drain area DA2, respectively. On the intermediate insulating layer IN, formed are a source electrode S1 of the driving TFT T1 contacting the source area SA1 of the driving TFT T1, and a drain electrode D2 of the compensation TFT T2 contacting the drain area DA2 of the compensation TFT T2.

On the substrate SUB having the top gate type TFTs T1 and T2, a first passivation layer PAS1 is deposited. By penetrating the first passivation layer PAS1, a pixel contact hole PH exposing some portions of the drain electrode D2 of the compensation TFT T2 is formed.

On the first passivation layer PAS1, a pixel electrode PXL contacts the drain electrode D2 of the compensation TFT T2 via the pixel contact hole PH. A second passivation layer PAS2 is deposited on the substrate SUB having the pixel electrode PXL. A common electrode COM is formed on the second passivation layer PAS2. The common electrode COM is overlapped with the pixel electrode PXL by the second passivation layer PAS2 therebetween. Between the pixel electrode PXL and the common electrode COM, the fringe electric field is formed. Further, the storage capacitance is formed within the overlapped space between the pixel electrode PXL and the common electrode COM.

Until now, we will explain about the thin film transistor substrate for the liquid crystal display in which two thin film transistors having the poly silicon semiconductor material are included in every pixel area. The concept of the present disclosure can be applied to other type thin film transistor substrate having other semiconductor material and other TFT structure. Furthermore, even though these embodiments are focused on the fringe field switching type liquid crystal display, the key concept of the present disclosure can be applied to the in-plane switching type liquid crystal display.

In the present disclosure, we will explain about the liquid crystal display. The main idea of the present disclosure is to ensure high aperture ratio in the flat panel display having the super ultra high density resolution over 300PPI. Therefore, the main concept of the present disclosure can be applied to any flat panel display using the thin film transistor substrate such as an organic light emitting diode display.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:
1. A thin film transistor substrate, comprising:
gate lines running in a horizontal direction and data lines running in a vertical direction which define a plurality of pixel areas on a substrate;
a first gate electrode and a second gate electrode formed by dividing any one of the gate lines into two substantially parallel electrode lines between two adjacent undivided portions of each of the gate lines along the horizontal direction;

a first thin film transistor connected to the first gate electrode; and a second thin film transistor connected to the first thin film transistor and the second gate electrode, wherein the first and second thin film transistors are interposed in a first area located between a first pixel area and a second pixel area of the plurality of pixel areas, and each of the undivided portions of each of the gate lines are interposed in a second area located between a third pixel area and a fourth pixel area of the plurality of pixel areas such that the first area and the second area are alternating areas along each of the gate lines on the substrate.

2. The thin film transistor substrate according to the claim 1, further comprising:

a semiconductor layer extending from the first pixel area crossing the first gate electrode to the second pixel area crossing the second gate electrode, wherein a drain area of the first thin film transistor and a source area of the second thin film transistor are connected through the semiconductor layer.

3. The thin film transistor substrate according to the claim 2, wherein the first thin film transistor includes:

a first source electrode branching from a data line and contacting one side of the semiconductor layer;

a first channel layer including a portion of the semiconductor layer overlapping by the first gate electrode; and a first drain area extending from the first channel layer, wherein the second thin film transistor includes:

a second source area extending from the first drain area and including a portion of the semiconductor layer;

a second channel layer extending from the second source area and overlapping by the second gate electrode; and a second drain electrode contacting other side of the semiconductor layer extending from the second channel layer.

4. The thin film transistor substrate according to the claim 1, further comprising:

a first semiconductor layer formed at a first side and crossing the first gate electrode and the second gate electrode to extend from the first pixel area to the second pixel area, wherein the first semiconductor layer is connected to a first pixel electrode formed in the first pixel area, and a second semiconductor layer is connected to a second pixel electrode formed in the second pixel area.

5. The thin film transistor substrate according to the claim 4, wherein the first semiconductor layer is connected to a first data line disposed at one side, and the second semiconductor layer is connected to a second data line disposed at an opposite side.

6. The thin film transistor substrate according to the claim 1, further comprising:

a first pixel electrode connected to the second thin film transistor;

a passivation layer covering the first pixel electrode; and a common electrode overlapping with the first pixel electrode on the passivation layer.

7. The thin film transistor substrate according to the claim 6, wherein the first pixel electrode is a surface electrode having a rectangular shape, and the common electrode is overlapped with the first pixel electrode and has a plurality of segments which are disposed in parallel with a certain gap.

8. The thin film transistor substrate according to the claim 1, wherein the first and second thin film transistors provide a drive signal to a first pixel electrode disposed at the first pixel area.

9. The thin film transistor substrate according to the claim 1, wherein the first thin film transistor and the second thin film transistor are disposed at different pixel areas of the plurality of pixel areas.

10. The thin film transistor substrate according to the claim 9, wherein the first thin film transistor is positioned at the second pixel area, and the second thin film transistor is disposed at the first pixel area.

11. The thin film transistor substrate according to the claim 2, wherein the semiconductor layer is made of poly silicon material.

* * * * *